United States Patent
Yoshino et al.

(10) Patent No.: US 12,074,065 B2
(45) Date of Patent: Aug. 27, 2024

(54) SEMICONDUCTOR DEVICE PRODUCTION METHOD

(71) Applicant: Mitsubishi Electric Corporation, Tokyo (JP)

(72) Inventors: Tatsuro Yoshino, Tokyo (JP); Masato Suzuki, Tokyo (JP); Masato Negishi, Tokyo (JP); Kenji Yoshikawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 928 days.

(21) Appl. No.: 16/960,831

(22) PCT Filed: Mar. 29, 2018

(86) PCT No.: PCT/JP2018/013224
§ 371 (c)(1),
(2) Date: Jul. 8, 2020

(87) PCT Pub. No.: WO2019/186888
PCT Pub. Date: Oct. 3, 2019

(65) Prior Publication Data
US 2020/0357698 A1    Nov. 12, 2020

(51) Int. Cl.
*H01L 21/78*    (2006.01)
*H01L 33/00*    (2010.01)
(Continued)

(52) U.S. Cl.
CPC .......... *H01L 21/78* (2013.01); *H01L 33/0095* (2013.01); *H01S 5/0202* (2013.01); *H01S 5/04256* (2019.08)

(58) Field of Classification Search
CPC ............. H01S 5/04256; H01S 5/04254; H01S 5/0207; H01L 21/78; H01L 2933/0008
See application file for complete search history.

(56) References Cited

U.S. PATENT DOCUMENTS

| | | | | |
|---|---|---|---|---|
| 5,604,761 A | * | 2/1997 | Seki | H01S 5/4031 372/44.01 |
| 2007/0131939 A1 | * | 6/2007 | Kohda | H01S 5/1082 257/79 |

(Continued)

FOREIGN PATENT DOCUMENTS

| | | |
|---|---|---|
| JP | S62113490 A | 5/1987 |
| JP | H05304339 A | 11/1993 |

(Continued)

OTHER PUBLICATIONS

Office Action issued in JP 2018-543731; mailed by the Japanese Patent Office on Oct. 3, 2018.

(Continued)

*Primary Examiner* — Erik T. K. Peterson
(74) *Attorney, Agent, or Firm* — Studebaker & Brackett PC

(57) ABSTRACT

A semiconductor device production method includes providing a first electrode and a second electrode on a rear surface of a substrate where an active region emitting light is formed and providing a laminated object formed of a material less brittle than the substrate at part of a region between the first electrode and the second electrode so as to position directly below the active region; and exposing a plane on which the active region appears by cleavage of the substrate together with the laminated object in a state where the laminated object is located directly above the active region.

10 Claims, 5 Drawing Sheets

(51) Int. Cl.
   *H01S 5/02*    (2006.01)
   *H01S 5/042*   (2006.01)

(56) References Cited

U.S. PATENT DOCUMENTS

| | | | | |
|---|---|---|---|---|
| 2008/0042244 | A1* | 2/2008 | Anzue | H01S 5/02 |
| | | | | 257/E25.001 |
| 2008/0111142 | A1* | 5/2008 | Furushima | B82Y 20/00 |
| | | | | 438/33 |
| 2009/0111203 | A1* | 4/2009 | Nakamura | H01L 33/0095 |
| | | | | 438/33 |
| 2009/0267100 | A1* | 10/2009 | Miyake | B82Y 20/00 |
| | | | | 438/33 |
| 2010/0248448 | A1* | 9/2010 | Nakamura | H01L 21/78 |
| | | | | 438/460 |
| 2011/0216798 | A1* | 9/2011 | Sugai | H01S 5/04254 |
| | | | | 438/33 |
| 2020/0066590 | A1* | 2/2020 | Yoshino | H01L 21/78 |

FOREIGN PATENT DOCUMENTS

| | | | |
|---|---|---|---|
| JP | 2002026443 | A | 1/2002 |
| JP | 2009117616 | A | 5/2009 |
| JP | 2010050199 | A | 3/2010 |
| JP | 2010177455 | A | 8/2010 |
| JP | 2016063042 | A | 4/2016 |
| JP | 2017017193 | A | 1/2017 |

OTHER PUBLICATIONS

Office Action issued in JP 2018-543731; mailed by the Japanese Patent Office on Dec. 12, 2018.

International Search Report; Written Opinion; and Notification of Transmittal of the International Search Report and the Written Opinion of the International Searching Authority, or the Declaration issued in PCT/JP2018/013224; mailed May 15, 2018.

An Office Action mailed by China National Intellectual Property Administration on Oct. 12, 2023, which corresponds to Chinese Patent Application No. 201880091772.7 and is related to U.S. Appl. No. 16/960,831; with English translation.

An Office Action mailed by China National Intellectual Property Administration on Mar. 23, 2024, which corresponds to Chinese Patent Application No. 201880091772.7 and is related to U.S. Appl. No. 16/960, 831; with English language translation.

* cited by examiner

SEMICONDUCTOR DEVICE PRODUCTION METHOD

FIELD

The present invention relates to a semiconductor device production method.

BACKGROUND

On a substrate such as a wafer, a plurality of semiconductor devices where light is emitted are formed. For the substrate, a process of cleavage in which split along a resonator length direction of the semiconductor devices at intervals of the devices is performed. Cleavage is a method for creating a surface where light is emitted. By cleavage, an optically flat surface can be obtained. Difficulty in cleavage is easily influenced by a thickness of the substrate. A thick substrate makes cleavage itself difficult; a thin substrate makes handling of the substrate difficult.

PTL 1 discloses that a substrate product which has a back surface including a plurality of first grooves and a plurality of second grooves and includes a semiconductor structure for an optical waveguide provided in each element segment is prepared and the back surface of the substrate product is pressed to form another substrate product and a semiconductor bar.

PRIOR ART

Patent Literature

[PTL 1]: JP 2017-17193A

SUMMARY

Technical Problem

In setting a substrate such as a wafer on a device used for cleavage, a front surface side of the substrate is set face down and a rear surface side thereof is set face up in many cases. On the rear surface of the substrate, an electrode is formed. However, in order to improve cleavage separability, an electrode is not formed in a region where a cleavage crack occurs on a substrate rear surface side, in some cases. That is, part where the substrate is exposed is left on the rear surface of the substrate. When cleavage is performed in this state, the cleavage can be advanced without receiving resistance of an electrode and therefore, good substrate separability can be obtained. However, there have been cases where substrate scraps generated from a brittle substrate part on the substrate rear surface side fall on an end surface where cleavage have been performed and adhere to an active region where light is emitted. If foreign matters such as substrate scraps adhere to an active region, characteristics of a semiconductor device may be deteriorated.

The present invention has been made in order to solve the above-mentioned problem and it is an object of the present invention to provide a semiconductor device production method capable of preventing adherence of foreign matters while ensuring the separability of a substrate.

Means for Solving the Problems

According to the present invention, a semiconductor device production method comprising providing a first electrode and a second electrode on a rear surface of a substrate, an active region being formed on the substrate, and providing a laminated object less brittle than the substrate at part of a region between the first electrode and the second electrode so as to position the laminated object directly below the active region, and cleaving the substrate together with the laminated object in a state of having the laminated object positioned directly above the active region.

Other features of the present invention will be disclosed below.

Advantageous Effects of Invention

According to this invention, a laminated object, a groove part, or the both are provided directly above an active region; and thereby, adherence of foreign matters can be prevented while the separability of a substrate is ensured.

DESCRIPTION OF EMBODIMENTS

A semiconductor device production method according to embodiments will be described with reference to drawings. Identical or corresponding components are denoted by identical reference signs and repeated descriptions thereof may be omitted.

First Embodiment

Figure 1:
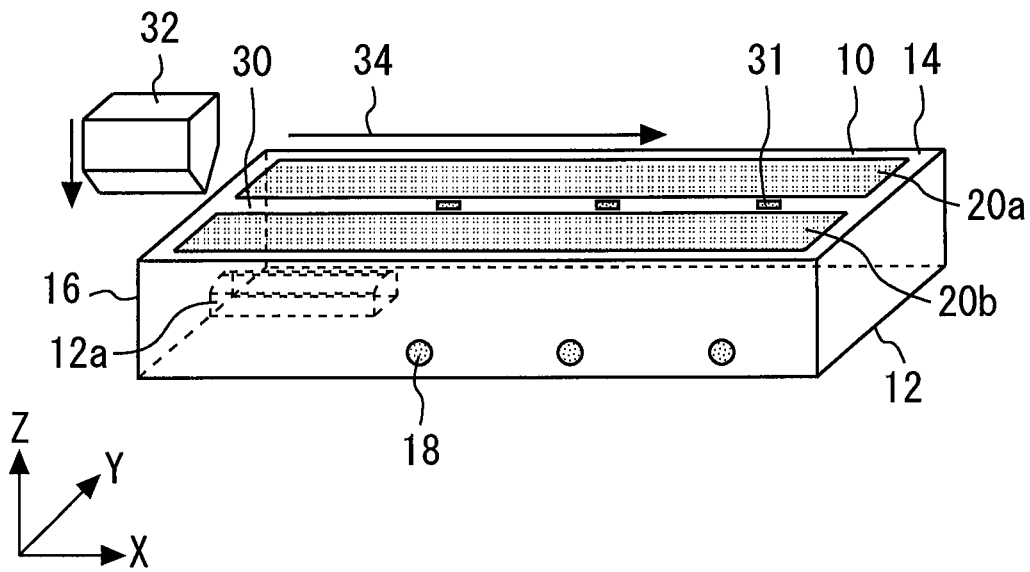
FIG. 1 is a perspective view of a semiconductor device before cleavage.

FIG. 1 is a perspective view of a semiconductor device before cleavage. The semiconductor device that is to be cleaved includes a substrate 10. The shape and material of the substrate 10 are not particularly limited. The substrate 10 is, for example, a wafer using indium phosphide or gallium arsenide as its material. The substrate 10 includes a front surface 12, a rear surface 14, and an end surface 16. In FIG. 1, the substrate 10 which is set in a cleaving device in a state where the rear surface 14 is on an upper side and the front surface 12 is on a lower side is shown.

In this substrate 10, a semiconductor layer, an insulator layer, and the like are fabricated by processing from a side of the front surface 12, for example. As a result of such processing, an active region 18 where light is emitted is formed on the substrate 10. The active region 18 is provided in a plurality along an X direction. On the substrate 10, a plurality of semiconductor laser elements or a plurality of light emitting diodes are formed in an unseparated state, for example. A Y direction is a resonator direction and a Z direction is a direction defining a thickness of the substrate 10.

On a rear surface 14 of the substrate 10, a first electrode 20a and a second electrode 20b are formed by a vapor deposition or plating method, for example. Between the first electrode 20a and the second electrode 20b, a cleavage introduction part 30 that is a region where the substrate 10 is exposed exists. The cleavage introduction part 30 is provided slenderly in the X direction. In cleaving the substrate 10, cleavage is advanced along this cleavage introduction part 30.

At part of the cleavage introduction part 30 that is a region between the first electrode 20a and the second electrode 20b, a laminated object 31 is provided. The laminated object 31 is provided in plurality in an insular form along the X direction of the substrate 10. Each of the laminated objects 31 is formed of a material that is less brittle than the substrate 10. For example, as the substrate 10 is a semiconductor, by making a material of the laminated object 31 the same as a material of the first electrode 20a and the second electrode 20b, the brittleness of the laminated object 31 can be made less than the brittleness of the substrate 10. Every material that is less brittle than the substrate 10 can form the laminated object 31. Therefore, the laminated object 31 is not limited to a metal. In addition, the laminated object 31 may be a lamination of not only a single material but also a plurality of materials. Examples of the laminated object 31 include a gold compound. Furthermore, a thickness of the laminated object 31 may be matched with a thickness of the first electrode 20a and the second electrode 20b, or may be made different from it.

Figure 2:
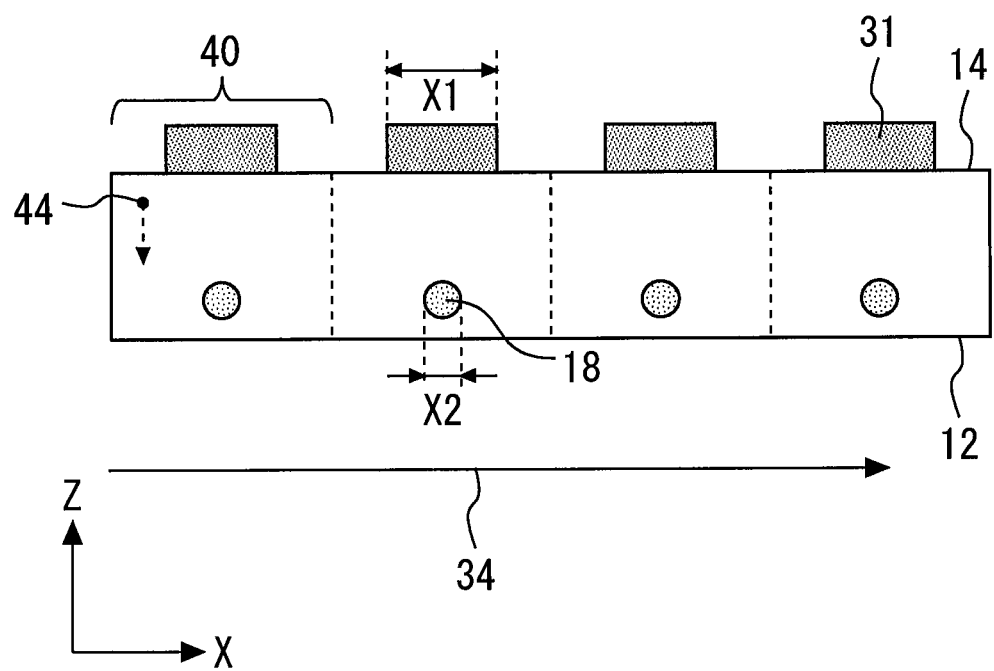
FIG. 2 is a side view of the semiconductor device.

FIG. 2 is a side view of the semiconductor device in FIG. 1 when viewed from the Y direction. A structure including one active region 18 and one laminated object 31 constitutes one chip 40 after separation. Since the laminated object 31 is provided so as to be positioned directly below the active region 18, the laminated object 31 is positioned directly above the active region 18 in a state where the rear surface 14 is on an upside and the front surface 12 is on a downside. In other words, X coordinates of the laminated object 31 and the active region 18 match. As long as at least part of the laminated object 31 is positioned directly above the active region 18, the laminated object 31 can be variously positioned with respect to the active region 18. For example, the laminated object 31 can be formed throughout directly below the active region 18.

In FIG. 2, an arrow 34 indicates a cleavage advancing direction. In one example, a length X1 of the laminated object 31 in the cleavage advancing direction can be more than a length X2 of the active region 18 in the cleavage advancing direction. By doing so, the laminated object 31 can be arranged also directly above both a right side and left side of the active region 18. The length X2 is, for example, 10 μm. The length X1 of the laminated object 31 can be twice as much as or more than the length X2 of the active region 18.

Go back to the description of FIG. 1. In performing cleavage, the substrate 10 is set in the cleaving device in a state where the rear surface 14 of the substrate 10 is on an upside. In a cleaving method, a blade 32 is pressed against the cleavage introduction part 30 on the rear surface 14 to apply a load to the substrate 10, thereby splitting the substrate 10. At this time, cleavage of the substrate 10 advances from a scribed part 12a which is formed on the front surface 12. The scribed part 12a is a flaw which is formed on the front surface 12 by a point created by diamond or the like, for example.

The advancing direction of cleavage starting from the scribed part 12a is indicated by the arrow 34. Cleavage advances in an X positive direction. In a state where the laminated object 31 is positioned directly above the active region 18, the substrate 10 is cleaved together with the laminated object 31.

Figure 3:
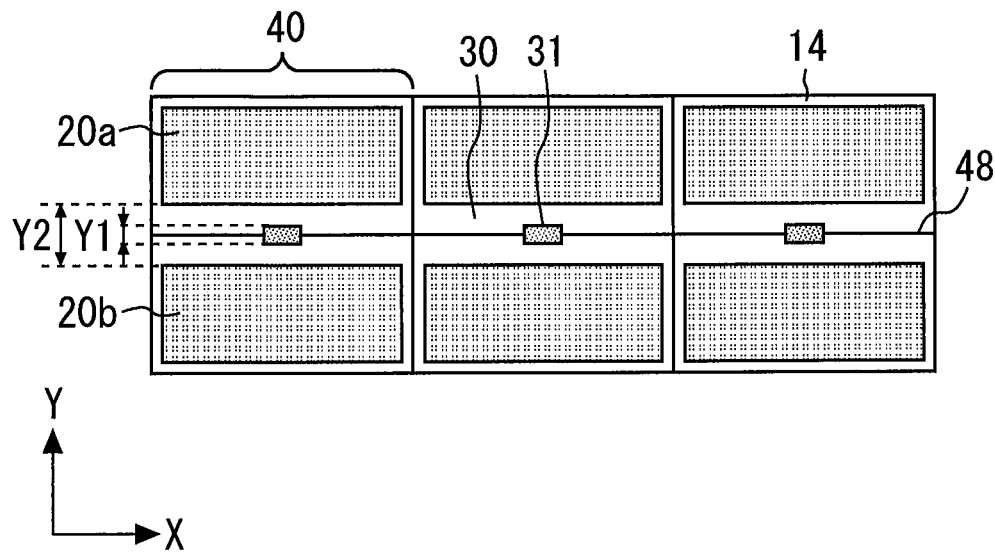
FIG. 3 is a plan view of the semiconductor device.

FIG. 3 is a plan view of the semiconductor device in FIG. 1. The laminated object 31 is away from the first electrode 20a and the second electrode 20b. That is, the width Y1 of the laminated object 31 is smaller than the width Y2 of the cleavage introduction part 30. A cleavage line 48 indicates a line where cleavage is to be performed or path through which cleavage has been performed. The cleavage line 48 passes through the cleavage introduction part 30 and the laminated objects 31 formed thereon; does not pass through the first electrode 20a and the second electrode 20b.

In order to improve separability in cleavage, cleavage is performed along the cleavage introduction part 30 where the electrodes are not formed and the rear surface 14 is exposed. By doing so, cleavage cracking easily advances and the number of elements left unseparated can be reduced. However, part where the substrate 10 of the rear surface 14 is exposed is brittle and therefore, substrate scraps fall downward from a side of the rear surface 14 along with cleavage of this part. In FIG. 2, a falling direction of substrate scraps 44 is indicated by an arrow. If this substrate scraps 44 adhere to the active region 18, deterioration of characteristics or degradation of appearance yields will occur.

Therefore, in a first embodiment, the laminated objects 31 which are less brittle than the substrate 10 are provided only in the cleavage introduction part 30. Less brittleness means that the substrate scraps 44 are hardly generated. While an exposed part where the substrate 10 is exposed on the rear surface 14 is brittle, part where each of the laminated objects 31 is formed on the rear surface 14 has higher resistance against brittleness than the exposed part. This can prevent the substrate scraps 44 from occurring directly above the active region 18 at the time of cleavage and therefore, the substrate scraps 44 is made difficult to adhere to the active region 18. Especially by providing the laminated object 31 directly above the active region 18, a state where substrate scraps are difficult to generate directly above the active region 18 can be obtained.

Provision of the laminated object 31 makes separability of the substrate somewhat lower. If a laminated object is provided on the whole cleavage introduction part 30, separability of the substrate will be impaired similarly to a case where the electrodes are provided on the whole cleavage introduction part 30. Therefore, the laminated object 31 is formed on part of the cleavage introduction part 30 and the rear surface 14 is exposed to some degree on the cleavage introduction part 30. This can prevent foreign objects from adhering to the active region 18 while ensuring the separability of the substrate 10.

The semiconductor device production method according to the first embodiment may be variously modified within a range not losing the characteristics thereof. A semiconductor device production method according to the following embodiments have a lot of commonalities with the first embodiment and therefore, differences from the first embodiment will be mainly described.

Second Embodiment

Figure 4:
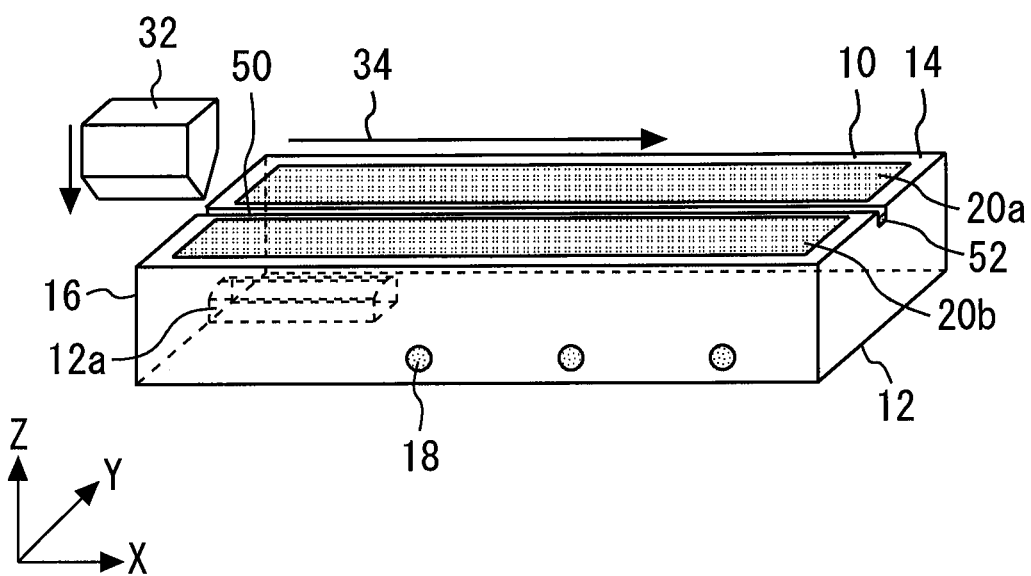
FIG. 4 is a perspective view of a semiconductor device before cleavage.

FIG. 4 is a perspective view of a semiconductor device before cleavage. On the cleavage introduction part 30, a groove part 50 is provided. The groove part 50 is provided so as to cross the substrate 10 in parallel with a cleaving direction. At a bottom of the groove part 50, a laminated object 52 that is less brittle than the substrate 10 is formed. This laminated object can be, for example, a material that is the same as the laminated object 31 in the first embodiment. The groove part 50 and the laminated object 52 within the same can be formed by a well-known wafer process technology. By providing the laminated object 52 in the groove part 50, a generation amount of substrate scraps can be reduced as compared with a case where the substrate 10 is exposed on the groove part 50.

In the second embodiment, cleavage is advanced along this groove part 50. The groove part 50 may be discontinuously provided in an insular form in a cleavage advancing direction. The groove part 50 is provided at least directly below the active region 18, so that, at a cleavage time, the groove part 50 is positioned directly above the active region 18. If a groove depth of the groove part 50 is too much, it is concerned that the substrate 10 may be broken in handling while the separability will be improved. In consideration of this point, the groove depth of the groove part 50 can be determined. For example, the groove depth of the groove part 50 can be set to half or less of the thickness of the substrate 10.

Figure 5:
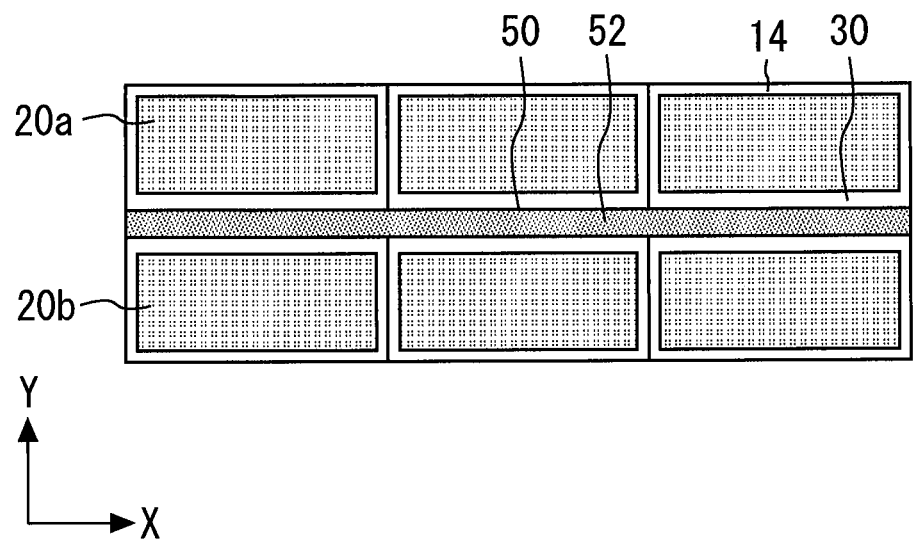
FIG. 5 is a plan view of the semiconductor device.

FIG. 5 is a plan view of the semiconductor device before cleavage. On the substrate 10 between the first electrode 20a and the second electrode 20b, the groove part 50 is provided. A width of a groove provided by the groove part 50 is smaller than a distance between the first electrode 20a and the second electrode 20b. That is, a width of the groove part 50 is smaller than a width of the cleavage introduction part 30. The width of the groove part 50 and the width of the cleavage introduction part 30 may be matched with each other.

Go back to the description of FIG. 4. The blade 32 is pressed against a bottom surface of the groove part 50 of the substrate 10 to apply a load, thereby cleaving the substrate 10 along the groove part 50. Cleavage is performed in a state where the groove part 50 is positioned directly above the active region 18. The groove part 50 may crosses a cross section that appears by the cleavage. At part where the groove part 50 is formed, the substrate 10 is thin and therefore, cleavage cracking easily advances, thereby improving cleavage separability. Furthermore, due to cleavage along the groove part 50, an amount by which the blade 32 presses the substrate 10 in a Z negative direction in cleavage can be smaller than a case where the groove part 50 is not provided. Consequently, substrate scraps can be made difficult to generate.

Figure 6:
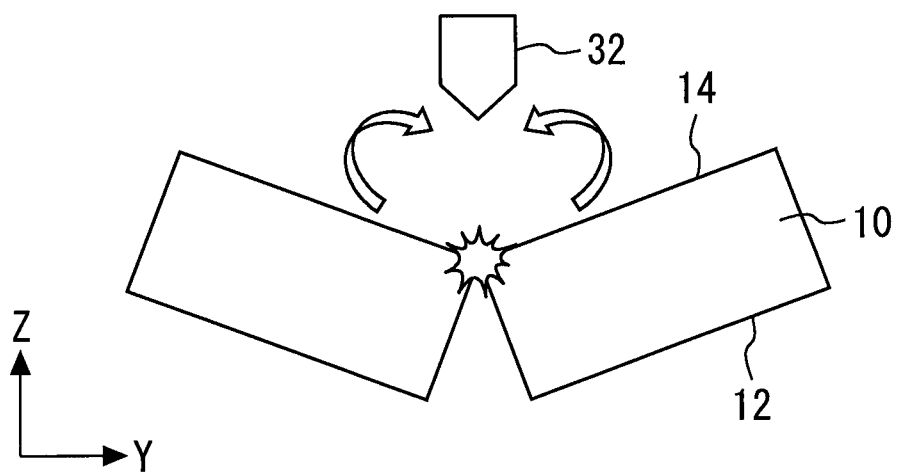
FIG. 6 is a view showing cleavage of the substrate without a groove part.
Figure 7:
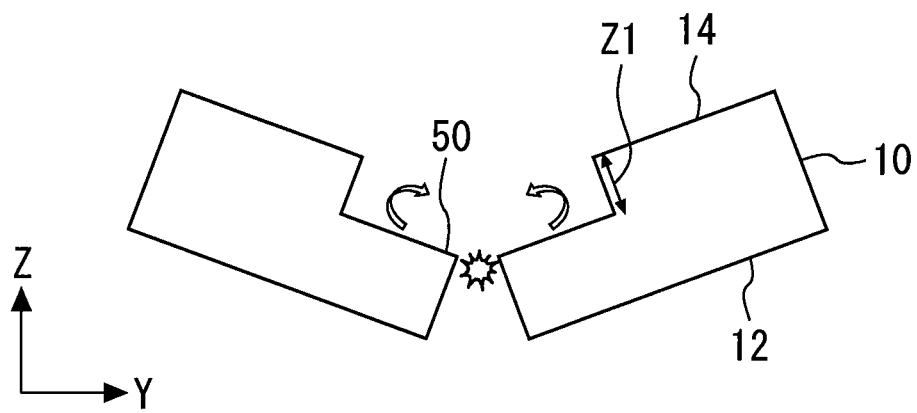
FIG. 7 is a view showing cleavage of the substrate with the groove part provided on the rear surface.
Figure 8:
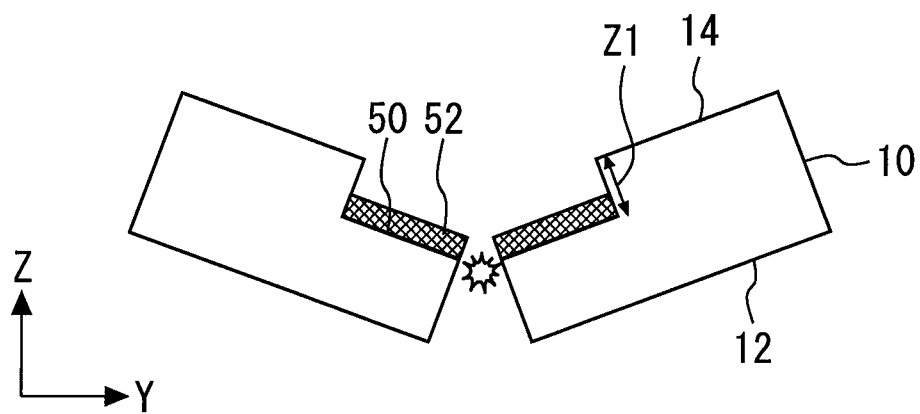
FIG. 8 is a view showing cleavage of the substrate with the laminated object provided on the groove part.

The significance of providing the groove part 50 and the laminated object 52 on the substrate 10 will be described with reference to FIGS. 6, 7, and 8. FIGS. 6 to 8 correspond to views of the substrate 10 seen from the X direction in FIG. 1. FIG. 6 is a view showing cleavage of the substrate 10 without a groove part. In performing cleavage, the substrate 10 is pressed and bent; and a shock from it causes substrate scraps to be generated. Especially, at part where the substrate 10 is exposed due to absence of electrodes on the rear surface 14 of the substrate 10, substrate scraps are easily generated.

FIG. 7 is a view showing cleavage of the substrate 10 with the groove part 50 provided on the rear surface 14. In cleaving along the groove part 50, the substrate 10 which is thinner than in cleaving part where the groove part 50 is not provided is cleaved. Therefore, the amount by which the blade 32 presses the substrate 10 in the Z negative direction can be reduced, allowing the occurrence of substrate scraps to be prevented.

FIG. 8 is a view showing cleavage of the substrate with the laminated object 52 provided on the groove part 50. The laminated object 52 is less brittle than the substrate 10. In this case, both thinning the substrate 10 by the groove part 50 and providing the laminated object 52 contribute to prevention of substrate scraps.

In the second embodiment, the long slender groove part 50 that crosses the substrate 20 along the cleavage advancing direction is provided. However, if the groove part 50 is formed on a chip where the scribed part 12a shown in FIG. 4 is provided, the substrate becomes thin and may be broken. Therefore, it may be possible that the groove part 50 is not formed on a chip where the scribed part 12a is formed and the groove part 50 is formed on a chip where the scribed part 12a is not formed.

Third Embodiment

Figure 9:
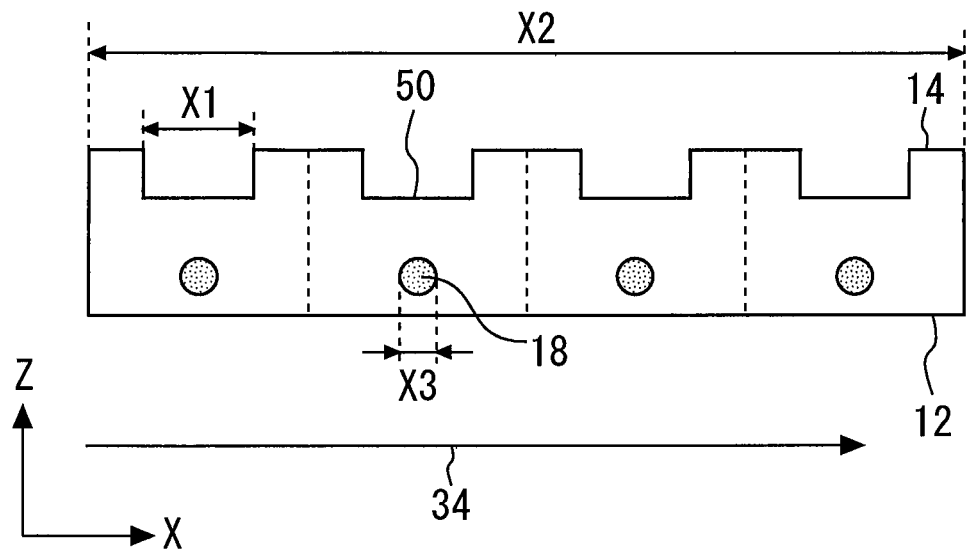
FIG. 9 is a view showing a semiconductor device production method.

FIG. 9 is a view showing a semiconductor device production method according a third embodiment. As in the second embodiment, if the groove part 50 crosses the cleavage introduction part 30, it is concerned that the substrate 10 may be easily broken in handling the substrate 10. Therefore, the groove part 50 of the third embodiment is provided only at a position corresponding to an X coordinate of the active region 18. As a result, the groove part 50 is discontinuously provided in plurality along an X axis in planar view. A length X1 of each of the groove parts 50 in the cleavage advancing direction is less than a length X2 of the substrate in the cleavage advancing direction. Furthermore, in one example, the length X1 of the groove part 50 may be more than a length X3 of the active region 18 in the cleavage advancing direction.

Cleavage is performed in a state where the groove part 50 is positioned directly above the active region 18. Due to the presence of the groove part 50, the substrate 10 is prevented from being largely bent directly above the active region 18 and thereby, the occurrence of substrate scraps can be prevented. This effect can be increased by setting a length X1 of the groove part 50 to be twice as much as or more than the length X3 of the active region 18. In addition, to prevent the substrate from being broken in handling the substrate 10, a groove depth Z1 of the groove part indicated in FIG. 7 can be half or less of the thickness of the substrate 10 at non-groove part, for example.

Fourth Embodiment

Figure 10:
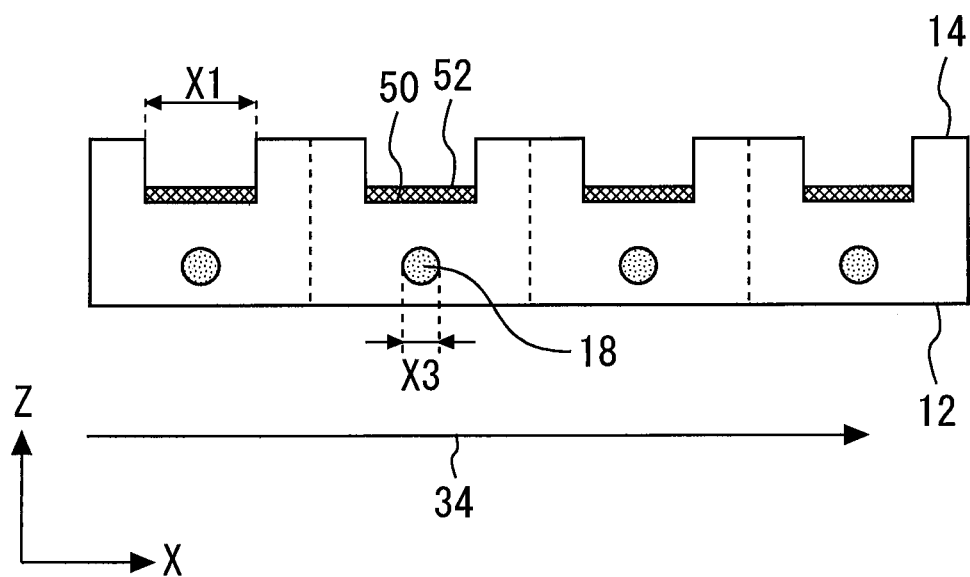
FIG. 10 is a view showing a semiconductor device production method.

FIG. 10 is a view showing a semiconductor device production method according a fourth embodiment. In the fourth embodiment, the groove part 50 is discontinuously provided in plurality as described for the third embodiment. Each of the groove parts 50 is positioned directly above each of the active regions 18. Furthermore, in the fourth embodiment, the laminated object 52 that is less brittle than the substrate 10 is formed in the groove part 50 before cleavage. Cleavage is performed along a cleavage line that passes through a plurality of the groove parts 50 which are discontinuously formed. Both thinning the substrate 10 by the groove parts 50 and providing the laminated objects 52 contribute to prevention of substrate scraps. The length and groove depth of each of the groove parts 50 can be set based on argument in the third embodiment.

DESCRIPTION OF SYMBOLS 10 substrate, 12 front surface, 14 rear surface, 18 active region, 20a first electrode, 20b second electrode, 30 cleavage introduction part, 31 laminated object

The invention claimed is:

1. A semiconductor device production method, comprising:
   providing a first electrode and a second electrode on a rear surface of a substrate, a plurality of active regions being formed on the substrate, the active regions being closer to a front surface of the substrate than to the rear surface of the substrate, the front surface of the substrate being opposite to the rear surface of the substrate, and providing at least one laminated object less brittle than the substrate at part of a flat region between the first electrode and the second electrode so as to position the at least one laminated object directly below the active regions; and
   cleaving the substrate together with the at least one laminated object in a state of having the at least one laminated object positioned directly above the active regions respectively, wherein
   the at least one laminated object are away from the first electrode and the second electrode,
   the at least one laminated object break due to the cleaving, and
   during cleaving, fewer substrate scraps are generated directly below the at least one laminated object compared with portions of the substrate that are not directly below the at least one laminated object.

2. The semiconductor device production method according to claim 1, wherein
   the at least one laminated object are formed throughout directly below the active regions respectively.

3. The semiconductor device production method according to claim 1, wherein
   a material of the at least one laminated object are the same as a material of the first electrode and the second electrode.

4. The semiconductor device production method according to claim 1, wherein
   a length of each of the laminated objects in a cleavage advancing direction is more than a length of each of the active regions in the cleavage advancing direction.

5. The semiconductor device production method according to claim 4, wherein
   the length of each of the laminated objects in the cleavage advancing direction is at least twice as much as the length of each of the active regions in the cleavage advancing direction.

6. The semiconductor device production method according to claim 2, wherein
   a material of the at least one laminated object are the same as a material of the first electrode and the second electrode.

7. The semiconductor device production method according to claim 2, wherein
   a length of each of the laminated objects in a cleavage advancing direction is more than a length of each of the active regions in the cleavage advancing direction.

8. The semiconductor device production method according to claim 3, wherein
   a length of each of the laminated objects in a cleavage advancing direction is more than a length of each of the active regions in the cleavage advancing direction.

9. The semiconductor device production method according to claim 1, further comprising:
   providing at least one groove part on the rear surface of the substrate between the first electrode and the second electrode before cleaving the substrate, the at least one laminated object being positioned in the at least one groove part.

10. The semiconductor device production method according to claim 1, wherein
    the at least one laminated object comprises plural laminated objects, each of the laminated objects being positioned directly below the active regions respectively.

* * * * *